Feb. 21, 1967 F. W. JENKINSON 3,305,856

ANALOG TO DIGITAL CONVERSION APPARATUS

Filed Feb. 3, 1964

INVENTOR.
Frederic W. Jenkinson
BY Flehr and Swain
Attorneys

United States Patent Office 3,305,856

Patented Feb. 21, 1967

3,305,856
ANALOG TO DIGITAL CONVERSION APPARATUS

Frederic William Jenkinson, Lafayette, Calif., assignor to Systron-Donner Corporation, Concord, Calif., a corporation of California Filed Feb. 3, 1964, Ser. No. 341,949
1 Claim. (Cl. 340—347)

This invention relates to an analog to digital conversion apparatus and method, and more particularly to an analog to digital conversion apparatus and method which is particularly adapted for use in plug-in modules to operate with counters to act as voltmeters.

Plug-in modules have heretofore been provided for use with counters to act as voltmeters. Generally, the approach has been either to utilize a voltage to time conversion or a voltage to frequency conversion. For voltage to time conversion, a ramp generator is usually utilized. The ramp generator generates a precision ramp voltage which starts running up when the counter is initiated so that when the voltage of the ramp at any time is digitally represented by the counter because the ramp increases linearly with time as does the count which is stored by the counter. When the ramp voltage passes through a voltage proportional to the input voltage, the count is stopped. Thus, the counter registers the number which is proportional to the input voltage. Such a method and apparatus has two major limitations insofar as accuracy is concerned. First, the accuracy is limited to the ability to provide a perfect ramp; and secondly, the accuracy is limited by the accuracy of the discriminator which determines when a ramp voltage is equal to the input voltage. For voltage to frequency conversion, a ramp voltage is also generated and, therefore, has a similar accuracy limitation. In addition, there are more elaborate methods of making voltmeters out of counters as, for example, the utilization of a digital to analog converter inside a feedback loop so that a digital code is converted to an analog voltage that matches the input voltage. A greater accuracy has been achieved with this method. However, it has been found to be high in cost. There is, therefore, a need for a new and improved analog to digital conversion apparatus and method which overcomes the above named disadvantages.

In general, it is an object of the present invention to provide an analog to digital conversion apparatus and method in which the above named disadvantages are overcome.

Another object of the invention is to provide an apparatus and method of the above character which does not require the generation of a ramp voltage having a precision ramp.

Another object of the invention is to provide an apparatus and method of the above character in which the duty cycle is controlled by the input voltage.

Another object of the invention is to provide an apparatus and method of the above character in which relatively high accuracy can be obtained with relatively inexpensive and simple circuitry.

Additional objects and features of the invention will appear from the following description in which the preferred embodiment is set forth in detail in conjunction with the accompanying drawings.

Referring to the drawings.

Figures 1, 2:
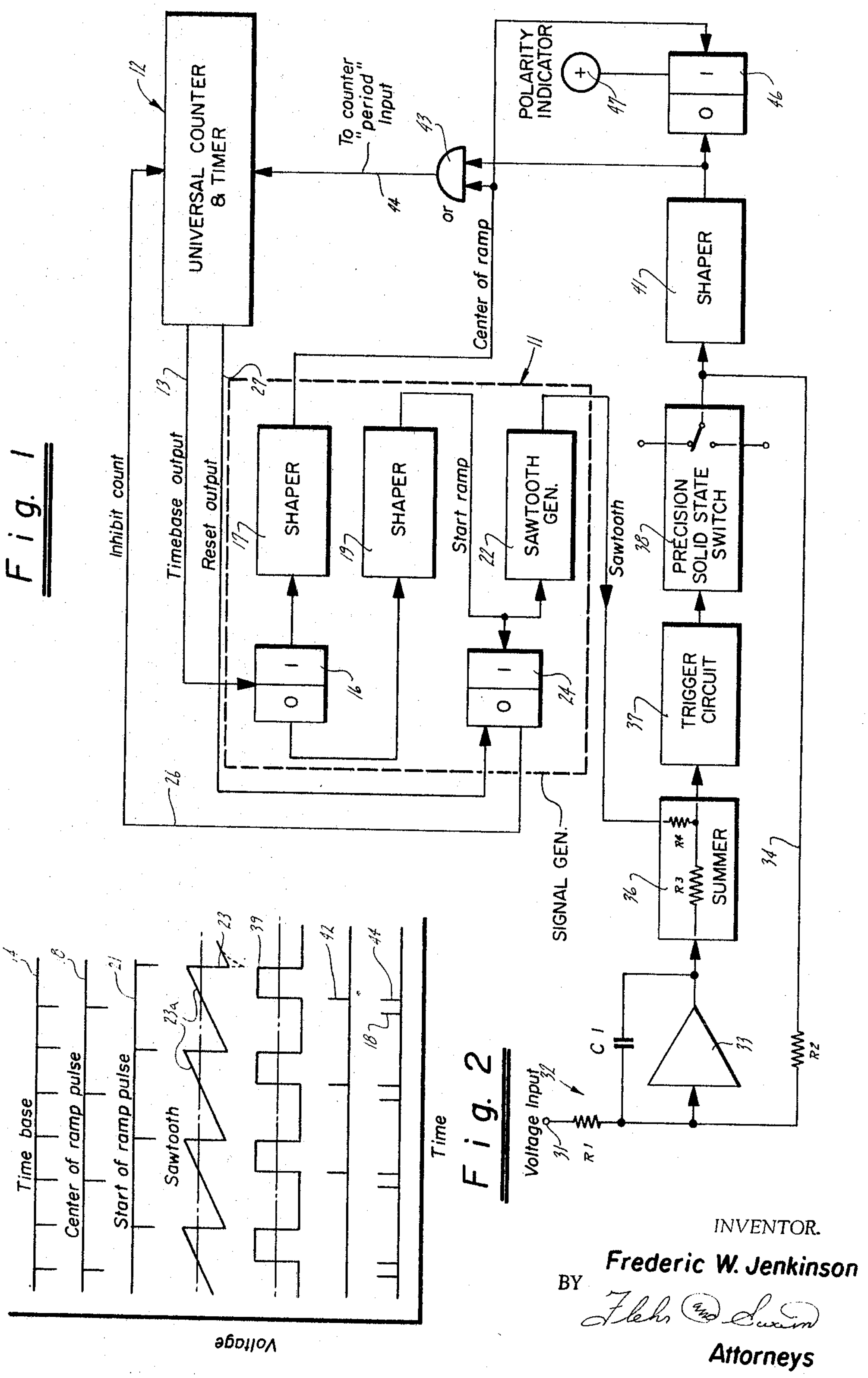
FIGURE 1 is a block diagram of an analog to digital conversion apparatus incorporating my invention and utilizing my method.
FIGURE 2 is a graph showing various wave shapes which appear in the apparatus shown in FIGURE 1.

In general, my apparatus for converting analog information to digital information consists of means for generating a sawtooth waveform having a precisely determined period. Switching means is provided which switches between a positive and a negative voltage in accordance with the sawtooth waveform to produce a rectangular waveform which has a period which corresponds to the period of the sawtooth. Means is provided for combining the rectangular waveform with the input information to produce an error signal which is integrated to establish a duty cycle which is proportional to the analog information. Means is provided for using the information in the rectangular waveform and includes means for generating a signal at the time center of each ramp of the sawtooth waveform. Means is provided for combining the center of ramp signal with the rectangular waveform to produce a plurality of pairs of signals in which the time interval between each pair of signals is proportional to the analog signal.

More in particular, as shown in FIGURE 1, my analog to digital conversion apparatus consists of a signal generator 11 and a universal counter and timer 12. The universal counter and timer 12 can be of a conventional type such as a Model 1034 manufactured by Systron-Donner Corp. of Concord, California. Such a universal counter and timer is provided with a time base output 13 which is represented by a plurality of negative pulses shown in the curve 14 in FIGURE 2 and which have a predetermined repetition rate as, for example, 100 cycles per second.

This time base is supplied to the signal generator 11 and, as shown in FIGURE 1, is supplied to a binary 16 which forms a part of the signal generator 11. The binary 16, which has one side connected to a shaper 17, selects every other pulse of the time base 14 and provides a squarewave output which is supplied to the shaper 17. The shaper 17 converts the square wave into sharp pulses 18 which can be identified as center of ramp or reference pulses which are shown in FIGURE 2. The other side of the binary 16 is connected to a shaper 19 which converts the sqaure wave representing the other pulses of the time base to sharp pulses 21 which can be identified as start of ramp pulses as shown in FIGURE 2. The start of ramp signal from the shaper 19 is supplied to a sawtooth generator 22 which supplies a sawtooth waveform 23 as shown in FIGURE 2 that has a plurality of upwardly inclined ramps *23a* which pass upwardly through zero volts.

The start of ramp pulses are also supplied to a binary 24. The output of the zero side of the binary 24 is connected by line 26 to the universal counter and timer 12 and supplies an inhibit count signal for a purpose as hereinafter explained. The reset output of the timer and counter 12 is supplied to the binary 24 through the line 27 for a purpose hereinafter described.

The binaries 16 and 24, the shapers 17 and 19, and the sawtooth generator 22 which form a part of the signal generator 11 are substantially conventional and, therefore, will not be described in detail.

The analog information which it is desired to convert is supplied to a terminal 31. The analog information can be in any suitable form such as a voltage. This analog information is supplied through an input resistor R1 to an operational amplifier 32 which consists of a precision high again D.-C. amplifier 33 and a capaictor C1 which connects the output of the D.-C. amplifier 33 to the input of the D.-C. amplifier. The input of the amplifier 33 is also connected to a negative feedback circuit 34 which includes a feedback resistor R2. Thus, two inputs are combined and supplied to the amplifier 33.

As is well known to those skilled in the art, the operation amplifier 32 acts as an integrator of the summed input signals and provides an output in the form of a D.-C. level which can be termed a bias signal. This bias signal output of the operational amplifier is supplied to a summer 36 which can be in any suitable form such as the summing resistors R3 and R4 shown. The summing resistor R3 is connected to the output of the operational amplifier, whereas the summing resistor R4 is connected to the output of the sawtooth generator 22 which forms a part of the signal generator 11. Thus, it can be seen that the sawtooth waveform from the sawtooth generator 22 is summed with the D.-C. output from the operational amplifier 32 so that the sawtooth waveform is biased negatively or positively in accordance with the output of the operational amplifier.

This summed signal or, in other words, this biased sawtooth waveform from the summer 36 is supplied to a trigger circuit 37 which can be of any conventional type such as a Schmitt trigger circuit. The output of the Schmitt trigger is supplied to a precision solid state switch 38 which switches from a precision positive voltage to a precision negative voltage in accordance with the trigger circuit 37 to provide at its output a precision rectangular wave 39 as shown in FIGURE 2 having the same period as the sawtooth waveform. This precision rectangular wave 39 is supplied on the feedback circuit 34 to the input of the operational amplifier 32 as hereinbefore described. The rectangular wave 39 is also supplied to a shaper 41 which converts the rectangular wave into sharp pulses 42 as shown in FIGURE 2, which can be identified as timing pulses. The precision solid state switch 38 and the shaper 41 are both of a type which are conventional in the art.

The output pulses from the shaper 41 are supplied to an OR gate 43. The center-of-the-ramp pulses 18 from the shaper 17 are also supplied to the OR gate 43 so that the output from the OR gate 43 is a plurality of spaced pairs of pulses in which the spacing between the pulses of each pair is proportional to the analog information supplied to the input 31 for reasons hereinafter described and as shown by the curve 44. These pulse pairs are supplied to the counter "period" input of the universal counter and timer 12.

Polarity indicating means to indicate whether the analog input information is positive or negative is provided and consists of a binary 46. One side of the binary 46 is connected to the output of the shaper 41 and receives the pulses from the shaper 41, whereas the other side of the binary is connected to the center-of-the-ramp pulses from the shaper 17. The positive indicating side or the one side of the binary 46 is connected to a polarity indicator 47 of a suitable type such as a lamp.

Operation of the analog to digital conversion apparatus shown in FIGURE 1 for performing my method may now be briefly described as follows. The signal containing the analog information is supplied to the input terminal 31 and is summed through the resistors R1 and R2 with the rectangular waveform output from the switch 38 and is supplied to the operational amlifier 32. The operational amplifier integrates the summed signals and provides a D.-C. output level which is summed with the sawtooth waveform 23 in the summer 36 so that the output from the operational amplifier biases the sawtooth waveform. This bias determines where each ramp will trigger the trigger circuit 37 to cause operation of the switch 38 to thereby determine the portion of the rectangular wave 39 which is negative and the portion of the rectangular wave which is positive. Thus, it can be seen that the sawtooth waveform will cause the switch 38 to switch between equal plus and minus voltages at the sawtooth repetition rate so that the average current feedback through the feedback resistor R2 is equal to the average current in the resistor R1. However, the time at which the precision switch assumes one condition or the other is dependent both upon the output of the operational amplifier and the sawtooth waveform, added to it. Thus, when each ramp of the biased sawtooth waveform is above a predetermined voltage level or switching point, the output of the precision switch 38 will be at +V, and when it is below the predetermined voltage or switching point, the output of the precision switch 38 will be −V. Since this is the case, the operational amplifier 32 in conjunction with the precision switch 38, will have a precise duty cycle which is proportional to the input information or, in other words, the input voltage. Thus, the negative feedback from the precisioin switch 38 passing through resistor R2 and supplied to the operational amplifier 32 adjusts or biases the sawtooth to the level needed so that the duty cycle is proportional to the input voltage. The duty cycle can, therefore, be defined as being the ratio of time that the rectangular wave output from the precision switch 38 is positive in comparison to the time that it is negative. In view of the fact that the time that the rectangular wave is positive is proportional to the input voltage, the rectangular output from the precision switch can be directly measured by a digital counting device to give a digital readout.

The circuitry within the feedback loop 34 will stabilize at a duty cycle such that the average current fed back through the resistor R2 is equal to the current feed through the input resistor R1. If these currents are not equal, the duty cycle will be changed by the error signal which is fed back through the feedback loop 34. This is true even if no sawtooth signal were supplied because the sawtooth merely determines the repetition rate and phase. If the sawtooth signal was removed, the circuitry would still have a duty cycle proportional to the input voltage. However, this information cannot be readily converted into a digital reading because the time between cycles would be dependent upon the time constant around the negative feedback loop which cannot be precisely determined. If the sawtooth signal was present, but the operational amplifier removed, then the output from the circuitry would have the exact period established by the time base but the duty cycle would not be significant. Thus, it can be seen that without the sawtooth information, the output information is not significant and the same is true if the operational amplifier is removed with the sawtooth waveform being present. Under neither condition does the output have a precise relationship with respect to the input signal.

From the foregoing, it can be seen that for the output waveform from the precision switch to have a significant meaning, it must meet two conditions. First, the duty cycle of the output from the precision switch 38 must be proportional to the input signal. Second, the output from the precision switch must have a precise frequency which must remain constant at an absolutely defined constant value. When both of these conditions are met, the pulse width of the output waveform from the precision switch 38 is proportional to the input signal. Since this is the case, the time that the voltage output from the precision switch 38 is positive is proportional to the input signal. The sawtooth input utilized forces this to be true.

One important feature of my apparatus and method is that the accuracy of the information obtained is not dependent upon the waveform of the ramp but is only dependent upon the period that the ramp is running up provided the period of the ramp is precise. Thus, the ramp can run up in a non-linear fashion as long as such a non-linearity is repeated for a sufficient time to be corrected by the generation of an error signal supplied to the operational amplifier. As long as the ramp repeats, there is no requirement of amplitude or linearity. It, therefore, can be seen that the ramp merely provides a switching signal for the precision switch 38. The feedback through the operational amplifier adjusts the ramp to the level required so that the duty cycle is proportional to the input voltage.

As hereinbefore explained, the rectangular waveform output from the precision switch 38 contains information which can be directly measured to give a digital readout. Thus, as shown in the drawings, the center-of-ramp or reference signal is supplied to an OR gate 43. This center-of-ramp or reference signal is generated at a time exactly half way between the beginning of successive ramps, as shown particularly in FIGURE 2. Each reference pulse passes through the OR gate and is supplied to the counter and timer 12 at time $t_0$ to start the period of the count in the counter. A second pulse is supplied to end the period of the count. This second pulse is formed by the shaper 41 and causes a pulse to be derived at time $t_1$ which corresponds to the time that the output waveform from the precision switch 38 goes positive as shown in FIGURE 2. Thus, it can be seen that the time interval between the reference pulse 18 and the timing pulse 44 represents the time difference between the positive step of the rectangular waveform 39 and the time this event would occur if there is a 50:50 duty cycle. Since this is the case, the time between each pair of pulses is proportional to the input signal. Thus, it can be seen that a plurality of spaced pairs of pulses are supplied to the universal counter and timer 12 to give a direct digital indication of the analog input supplied to the apparatus. If the input voltage at terminal 31 is zero, the two pulses will occur simultaneously. If the input voltage to the terminal 31 varies between positive and negative, the phasing between the pulses will vary in the same way. Thus, when the voltage is positive, the phasing between the reference or center-of-ramp pulse and the timing pulse will be in one direction, whereas if the input voltage is negative, the phasing between the reference pulse and the timing pulse will be in an opposite direction. If it is assumed that the circuit is arranged so that when the voltage input is positive, the reference or center-of-ramp pulse will occur first and the timing pulse occurs second; as the input voltage goes more positive, the timing pulse will move to a later time with respect to the reference pulse. Conversely, if the input voltage is negative and it goes more negative, the timing pulse will occur earlier than the reference pulse. Thus, it can be seen that the polarity of the input determines which pulse occurs first, either the timing pulse or the reference pulse.

When the analog input can be either voltage, it is desirable to provide polarity indicating means as shown in the drawing. Thus, with the arrangement shown, the binary 46 will remain in the state which will depend upon the polarity of the last input measured. If the reference or center-of-ramp pulse is supplied first and the timing pulse is supplied second, the binary will be actuated so that the binary is in the condition shown in FIGURE 1 and will supply a voltage to the polarity indicator 47 to indicate that a positive voltage is present on the voltage input 31. Conversely, if the timing pulse is received first, the binary 46 will be triggered to the opposite condition to indicate that a negative voltage is being applied to the input terminal 31.

With the foregoing arrangement, it can be seen that the analog input is registered directly on the universal counter and timer 12 and that the polarity of the analog signal is registered on the polarity indicator 47.

As hereinbefore explained, means is provided for preventing the universal counter and timer 12 from starting a count cycle at the second pulse of a pulse pair. This is accomplished by the binary 24 of the signal generator 11 which is reset to a state by the reset output on the line 27 from the counter and timer 12 to inhibit the universal counter and timer from starting. At the commencement of the next ramp of the sawtooth waveform, a start-of-ramp pulse is supplied from the shaper 19 to the binary 24 to cause the binary 24 to be triggered to a state to allow the universal counter and timer 12 to count. Thus, it can be seen that the counter and timer 12 cannot start counting until after the start-of-ramp pulse has been generated which ensures that the counter will start counting with the first pulse received after the start-of-ramp pulse.

Although the information is supplied to the universal counter and timer 12 by means of pulse pairs occurring on the same channel, it is readily apparent that information can be supplied to digital readout apparatus in other ways utilizing the information contained in the rectangular waveform output from the precision switch 38. Thus, in addition to the rectangular waveform which contains the information, the information can also be given by positive and negative pulses or by pairs of positive or negative pulses on the same or separate channels.

From the foregoing, it can be seen that I have provided an apparatus and method whereby an analog input is converted to a time input which can readily be converted into a digital readout. As hereinbefore explained, the sawtooth waveform defines the total period of the rectangular output waveform. As soon as this is accomplished, the duty cycle is defined by the input signal so that the width or the time that the output is at one polarity must be proportional to the input signal.

Although in the embodiment shown, the duty cycle is varied by the input signal, it is readily apparent that either or both the period of the sawtooth or the duty cycle can be varied in accordance with the input voltage to thereby make possible multiplication and division if the same is desired.

From the foregoing, it can be seen that the accuracy of my apparatus and method for converting analog information to digital information is primarily dependent upon the accuracy of the precision positive and negative voltages supplied by the precision switch and also by the precision of the operational amplifier which is utilized. Since both of these devices can be made very precise in a manner well known to those skilled in the art, the accuracy of my apparatus and method is excellent.

I claim:

In apparatus for converting analog information to digital information, a counter, means for generating a sawtooth waveform with a precisely determined period and having a plurality of ramps, such means including means for forming a start-of-ramp pulse at predetermined time intervals together with means connected to such means for preventing said counter from starting to count at the second pulse in a pulse pair, switching means connected to said means for generating a sawtooth waveform and having an output which is switched between precise positive and negative voltages in accordance with the sawtooth waveform to produce a rectangular waveform which has a period which is precisely related to the period of the sawtooth waveform, means combining the rectangular waveform with the analog input to produce an error signal, means for integrating the error signal to produce a bias signal, means combining the bias signal with the sawtooth waveform, the bias signal serving to bias the sawtooth waveform so that the sawtooth waveform causes switching of the switching means at points determined by the bias so that the duty cycle of the rectangular waveform is proportional to the analog input signal, means for creating a reference pulse at a time precisely half-way between the start and completion of a ramp, means connected to the output of the switching means to create a timing pulse when the rectangular waveform goes positive, and means for supplying the reference pulses and the timing pulses to the counter whereby the time difference between a reference-pulse-timing-pulse pair is proportional to the analog input signal, polarity indicating means responsive to said reference and timing pulses for indicating a first polarity if said reference pulse is received first, and a second polarity if said timing pulse is received first.

References Cited by the Examiner

UNITED STATES PATENTS 3,148,366 9/1964 Schulz -------------- 340—347

MAYNARD R. WILBUR, *Primary Examiner.*

W. J. KOPACZ, *Assistant Examiner.*